(12) United States Patent
Steigerwalt et al.

(10) Patent No.: US 7,118,986 B2
(45) Date of Patent: Oct. 10, 2006

(54) STI FORMATION IN SEMICONDUCTOR DEVICE INCLUDING SOI AND BULK SILICON REGIONS

(75) Inventors: Michael D. Steigerwalt, Newburgh, NY (US); Mahender Kumar, Fishkill, NY (US); Herbert L. Ho, New Windsor, NY (US); David M. Dobuzinsky, New Windsor, NY (US); Johnathan E. Faltermeier, LaGrangeville, NY (US); Denise Pendleton, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/710,060

(22) Filed: Jun. 16, 2004

(65) Prior Publication Data

US 2005/0282392 A1  Dec. 22, 2005

(51) Int. Cl.
   *H01L 21/76* (2006.01)
(52) U.S. Cl. ............ 438/424; 438/151; 257/347; 257/348; 257/349; 257/350
(58) Field of Classification Search ............ None
See application file for complete search history.

(56) References Cited

U.S. PATENT DOCUMENTS 5,894,152 A    4/1999  Jaso et al.
6,218,266 B1*  4/2001  Sato et al. ............ 438/427
6,590,259 B1   7/2003  Adkisson et al.
6,825,545 B1  11/2004  Nasr
2003/0057487 A1*  3/2003  Yamada et al. ............ 257/347
2003/0119228 A1   6/2003  Oyamatsu
2003/0201512 A1  10/2003  Yamada et al.
2005/0045951 A1*  3/2005  Yamada et al. ............ 257/350

* cited by examiner

*Primary Examiner*—Duy-Vu N Deo
(74) *Attorney, Agent, or Firm*—Steven Capella; Hoffman, Warnick & D'Alessandro

(57) ABSTRACT

Methods for forming or etching silicon trench isolation (STI) in a silicon-on-insulator (SOI) region and a bulk silicon region, and a semiconductor device so formed, are disclosed. The STI can be etched simultaneously in the SOI and bulk silicon regions by etching to an uppermost silicon layer using an STI mask, conducting a timed etch that etches to a desired depth in the bulk silicon region and stops on a buried insulator of the SOI region, and etching through the buried insulator of the SOI region. The buried insulator etch for this process can be done with little complexity as part of a hardmask removal step. Further, by choosing the same depth for both the bulk and SOI regions, problems with a subsequent CMP process are avoided. The invention also cleans up the boundary between the SOI and bulk regions where silicon nitride residuals may exist.

26 Claims, 4 Drawing Sheets

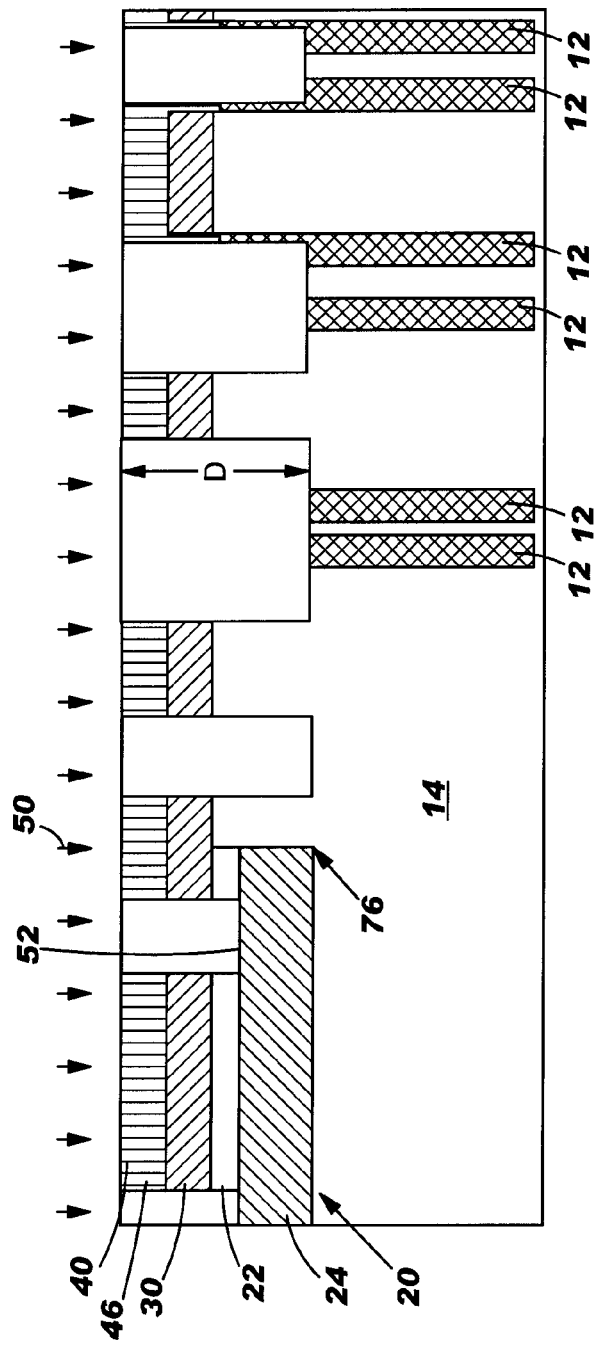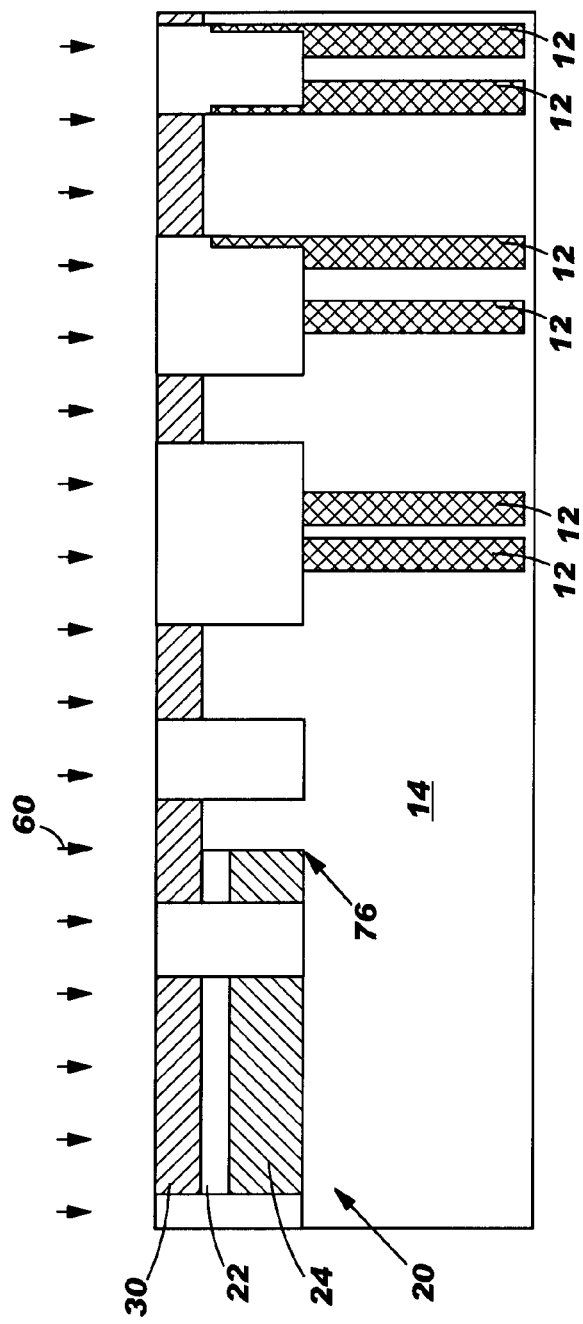

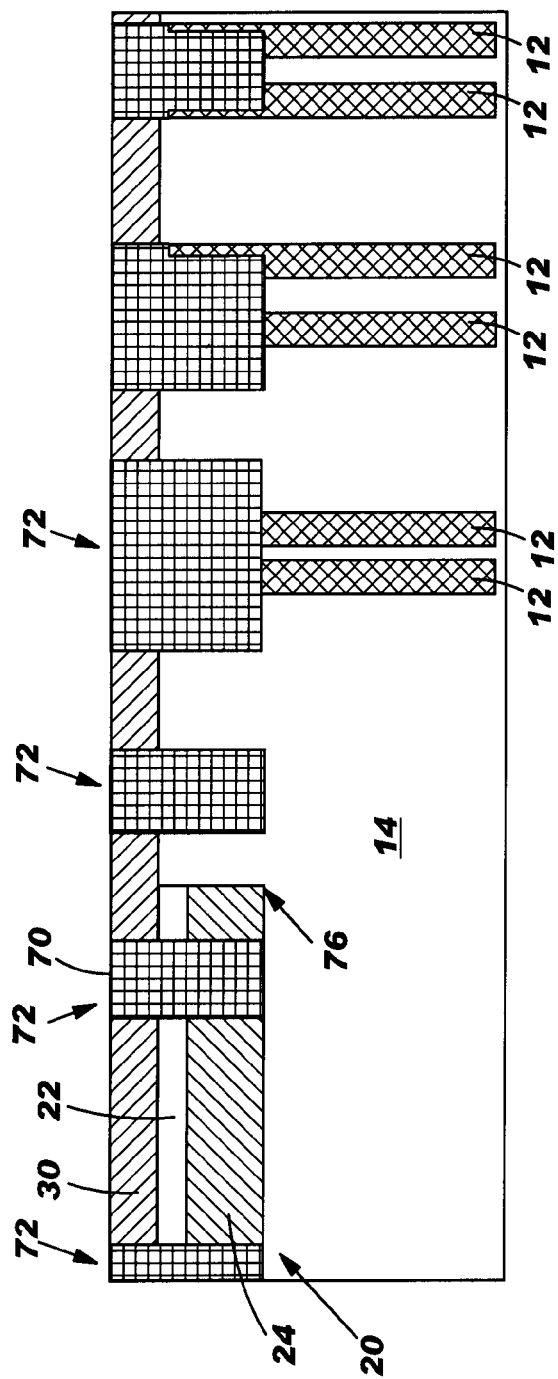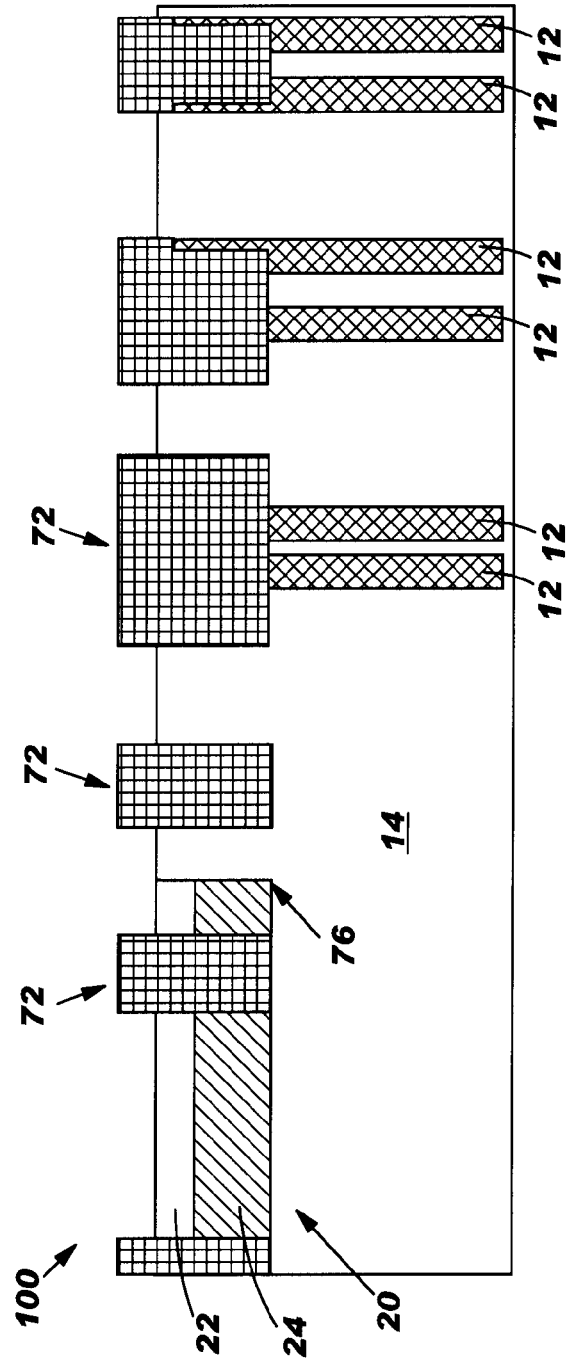

STI FORMATION IN SEMICONDUCTOR DEVICE INCLUDING SOI AND BULK SILICON REGIONS

BACKGROUND OF INVENTION

The present invention relates generally to shallow trench isolations (STI), and more particularly, to methods of forming an STI in a semiconductor device including a silicon-on-insulator (SOI) and bulk silicon regions.

As technologies become increasingly complex, demand for integrated circuits (IC) customer having more functionality is growing. In order to provide ICs with optimum designs, high-performance complementary metal-oxide semiconductors (CMOS) devices are required with additional features such as enhanced dynamic random access memory (eDRAM) or radio frequency (RF) applications. A challenge that arises relative to providing all of these features is that each feature is optimized under different conditions. For example, high-performance CMOS may be completed on silicon on insulator (SOI) wafers but RF and eDRAM may be built in bulk silicon.

Conventional techniques exist for making patterned SOI (part bulk and part SOI) wafers for the purposes of merging the best of "bulk technologies" with the best of "SOI technologies." One such technique that utilizes this approach is integrating eDRAM in SOI. In this case, the eDRAM array blocks are built in bulk silicon and logic is built in the SOI. Another technique that may use this approach is the emerging 65 nm on SOI technology. Substrates at the 65 nm stage may be comprised of Nfets on SOI and Pfets in bulk silicon. This process technology is referred to as "HOT" for Hybrid Orientation Technology.

One challenge facing both examples mentioned above is that fabricators must provide isolation of active diffusions for both SOI and bulk regions. Conventional techniques for providing this isolation require two separate shallow trench processes: one for the bulk silicon and one for the SOI. The above-described process is very complicated and cost-ineffective. In particular, there are a number of challenges with shallow trench isolation (STI) processing relative to patterned SOI versus bulk silicon.

A first challenge relates to the depth of etching for the STI. For SOI regions, the depth of the STI etch is the thickness of the silicon and the etch stops on top of the buried insulator, which is usually under 1000A in depth. For bulk processes, however, the depth of the STI is much deeper than current SOI thickness, e.g., usually 3500A or deeper. When patterning the SOI, there are a few choices for selecting an STI etch depth relative to bulk silicon. A first choice is to use the SOI STI etch depth, which does not give enough isolation in the bulk area. A second choice is to use the bulk STI etch depth, which is a very difficult etch to perform in the SOI region. A third choice is to have the STI etch depth in the SOI region equal to the normal depth in the SOI STI process and have the bulk silicon region depth equal to the normal bulk STI depth. This process, however, requires an extra photoresist layer and is likely to cause problems with STI planarization.

A second challenge with STI processing in patterned SOI arises from a particular process defect that is intrinsic to wafers created by using the Separation by Implantation of Oxygen (SIMOX) process. In a patterned SIMOX process, oxide hardmask islands are initially created on a bulk wafer, shielding wafer regions from a high-dose, high-energy oxygen implant. During the formation of the buried oxide (BOX), through a high-temperature oxidation procedure, the edges of the BOX (i.e., the BOX at the SOI-bulk boundary) become thicker than the BOX in the SOI field regions. In many instances along the boundary of the SOI-bulk area, the buried oxide actually breaches the surface of the wafer. Because an oxide etch is needed to remove the oxide that is grown on a SIMOX wafer, those areas where the buried oxide breaches the surface are also etched away leaving small divots on the wafer surface. The wafers then go through pad oxidation and pad silicon nitride (SiN) deposition. In the SiN deposition process, these holes become filled with nitride and can remain on the patterned wafer throughout most of the STI processing if they are not etched during the STI etch process. Once STI has been filled and planarized, pad SiN needs to be stripped off the wafer surface. Divots which form near the surface that have SiN plugged into them become free of SiN after etching, and will remain free of material until the next deposition step, i.e., gate polysilicon. Since polysilicon can be made electrically active either by doping or conversion to silicide divots filled with polysilicon can cause device shorting. This problem has been observed in early SOI eDRAM hardware. Thus, patterned SIMOX wafers must incorporate a process whereby nitride residuals lying in sub-surface divots are removed completely.

In view of the foregoing, there is a need in the art for a process the addresses the problems of the related art.

SUMMARY OF INVENTION

The invention includes methods for forming or etching silicon trench isolation (STI) in a silicon-on-insulator (SOI) region and a bulk silicon region, and a semiconductor device so formed. The STI can be etched simultaneously in the SOI and bulk silicon regions by etching to an upper-most silicon layer using an STI mask, conducting a timed etch that etches to a desired depth in the bulk silicon region and stops on a buried insulator of the SOI region, and etching through the buried insulator of the SOI region. The buried insulator etch for this process can be done with little complexity as part of a hardmask removal step. Further, by choosing the same depth for both the bulk and SOI regions, problems with a subsequent CMP process are avoided. The invention also cleans up the boundary between the SOI and bulk regions where silicon nitride residuals may exist.

A first aspect of the invention is directed to a method for forming a silicon trench isolation (STI) in a device including a silicon-on-insulator (SOI) region and a bulk silicon region, the method comprising the steps of: etching to an uppermost silicon layer using an STI mask; conducting a timed etch that etches to a desired depth in the bulk silicon region and stops on a buried insulator of the SOI region; etching through the buried insulator of the SOI region; and depositing an STI material to form the STI.

A second aspect of the invention is directed to a method for etching a silicon trench isolation (STI) in a mixed silicon-on-insulator (SOI) region and a bulk silicon region device, the method comprising the steps of: etching to an uppermost silicon layer using an STI mask; conducting a timed etch that etches to a desired depth in the bulk silicon region and stops on a buried insulator of the SOI region; and etching through the buried insulator of the SOI region.

A third aspect of the invention is directed to a semiconductor device including a silicon-on-insulator (SOI) region and a bulk silicon region, the semiconductor device comprising: a silicon trench isolation (STI) extending to a depth substantially equal to a thickness of a silicon layer and a buried insulator of the SOI region.

A fourth aspect of the invention is directed to a method for forming a silicon trench isolation (STI) in a device including a silicon-on-insulator (SOI) region and a bulk silicon region, the method comprising the steps of: providing an STI mask; and simultaneously forming the STI in the SOI region and the bulk silicon region.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein:

FIGS. 2–6 show cross-sectional views of methods of forming an STI or etching for an STI of the invention.

FIG. 7 shows a cross-sectional view of a semiconductor device of the invention.

DETAILED DESCRIPTION

Figure 1:
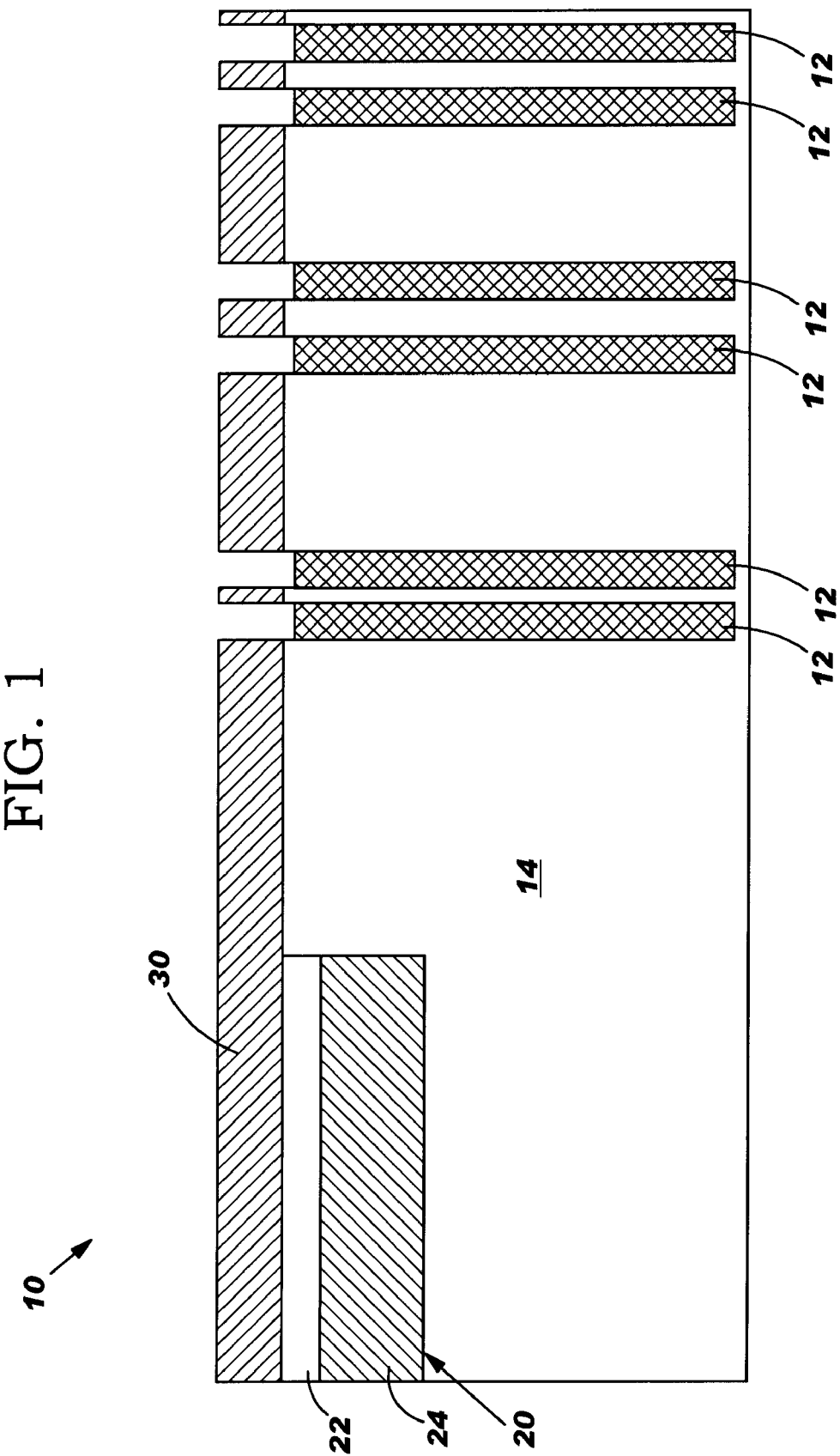
FIG. 1 shows a cross-sectional view of a wafer prior to application of the invention.

With reference to the accompanying drawings, FIG. 1 illustrates a cross-sectional view of a typical wafer 10 after deep trench 12 formation in a bulk silicon region 14, and prior to the silicon trench isolation (STI) hardmask deposition. Wafer 10 includes a silicon-on-insulator (SOI) region 20 including a silicon layer 22 on a buried insulator 24. Also included on wafer 10 is a pad layer 30 of, for example, silicon nitride and silicon dioxide.

In one embodiment, buried insulator 24 material is silicon dioxide, but other materials may also be used. For purpose of illustration only, silicon layer 22 of SOI region 20 may have a thickness of approximately 700A and buried insulator 24 of SOI region 20 may have a thickness of approximately 1350A. Pad layer 30 may have a thickness including approximately 80A of silicon dioxide (not shown due to scale) and approximately 1200A of silicon nitride. It should be recognized, however, that the teachings of the invention are not limited to these particular depths or the initial structural starting point of FIG. 1.

Figure 2:
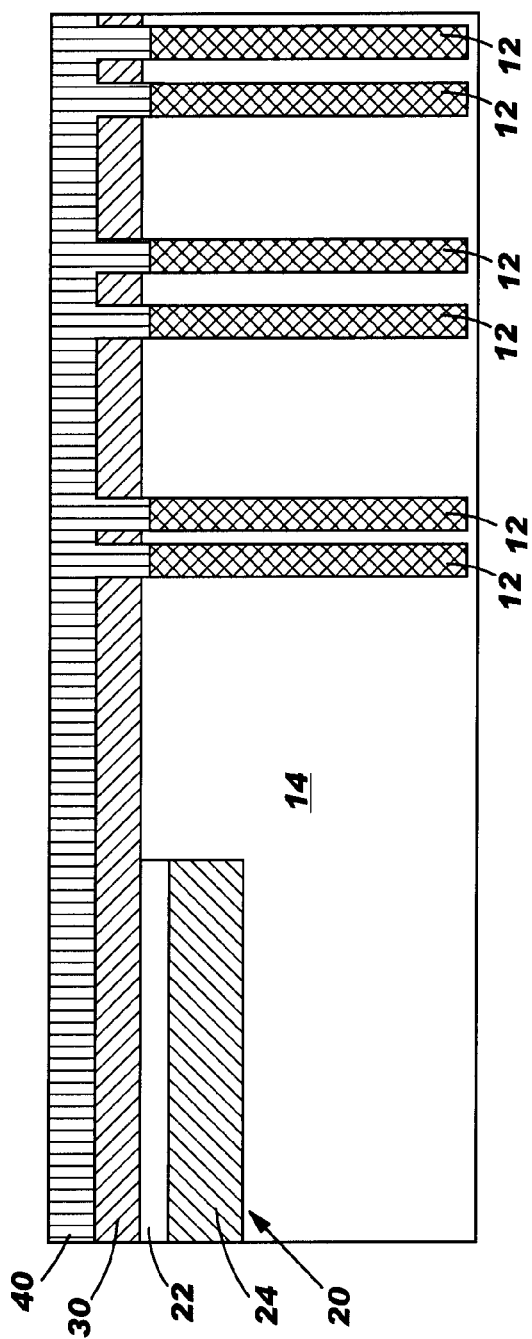
Figure 3:
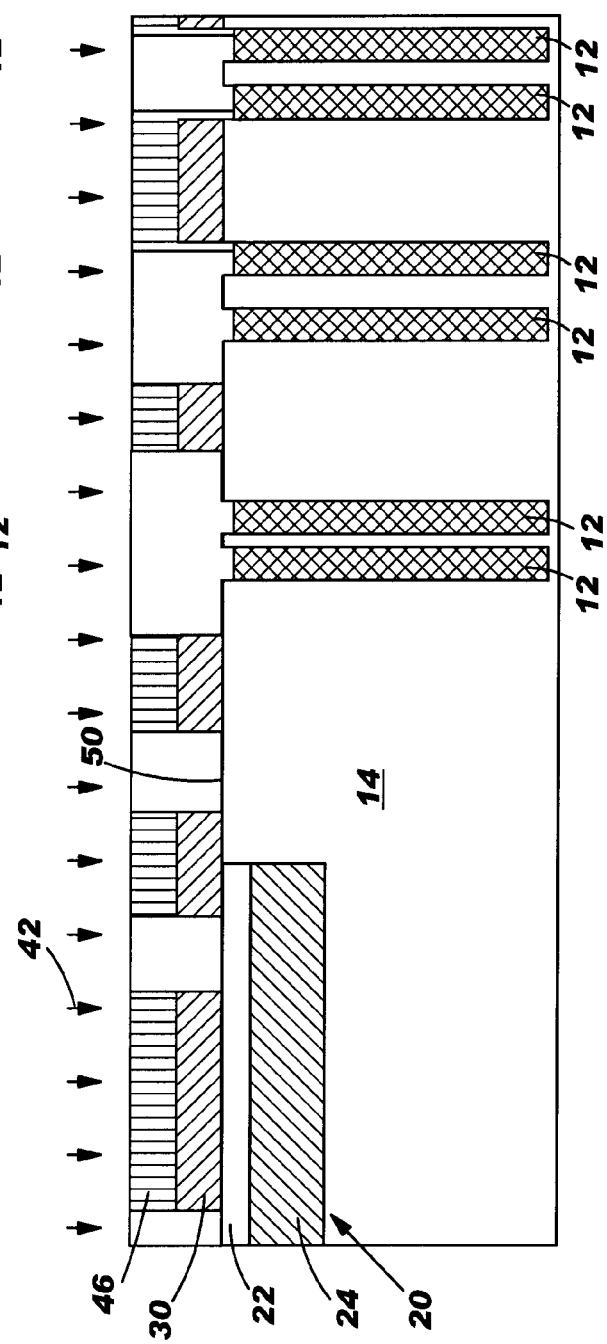

As shown in FIGS. 2–3, an STI mask is provided. In particular, as shown in FIG. 2, a hardmask layer 40 is deposited on top of pad layer 30, and into any openings. Hardmask layer 40 material has substantially the same etch characteristics as buried insulator 24. In one embodiment, hard-mask layer 40 includes approximately 1000A of tetra-ethyl orthosilicate (TEOS) or boron-doped silicate glass (BSG). Next as shown in FIG. 3, hardmask layer 40 is patterned and an etch 42 is conducted to form STI mask 46. Etch 42 extends through hardmask layer 40 and at least one of an antireflective coating (ARC)(not shown) and pad layer 30, stopping on an uppermost silicon layer 50, i.e., an upper-most surface of bulk silicon region 14 and silicon layer 22 of SOI region 20.

In a next step, shown in FIG. 4, a timed etch 50 is conducted that etches to a desired depth (D) in bulk silicon region 14 and stops on an uppermost surface 52 of buried insulator 22 of SOI region 20. In one embodiment, the desired depth D (and hence, the later formed STI) in bulk silicon region 14 will extend to a depth at least as thick as SOI region 20, i.e., to at least the depth of silicon layer 22 and buried insulator 34. Based on the illustrative depths above, the desired depth may be, for example, approximately 2050A, i.e., 700A of silicon layer 22 plus the 1350A of buried insulator 24. In one embodiment, timed etch 50 can be a reactive ion etch process, however, other etching processes may be implemented. In any event, timed etch 50 is selective to buried insulator 24 material, e.g., silicon dioxide, and etches both silicon layer 22 and any silicon nitride that could be below silicon layer 22 due to buried insulator 24 coming to the surface during the SOI formation process. This step also cleans a boundary 76 between SOI region 20 and bulk silicon region 14 where silicon nitride residuals may exist.

Referring to FIG. 5, a next step includes conducting an etch 60 through buried insulator 24 of SOI region 20. In a preferred embodiment, etch 60 is provided as part of a hardmask layer 40 (FIG. 3) removal etch. Etch 60 etches both hardmask layer 40 and buried insulator 24 material that is exposed. Etch 60, however, does not etch any exposed silicon, polysilicon or silicon nitride. That is, the etching recipe is incapable of etching any exposed silicon, polysilicon and silicon nitride.

Referring to FIG. 6, the next step includes depositing an STI material 70 to form STI 72. As shown in FIGS. 6–7, final processing may include conducting conventional high performance CMOS or DRAM technology polishing (in FIG. 6) to remove STI material 70 above an uppermost surface, and conducting a pad layer 30 (FIG. 6) strip to arrive at a semiconductor device 100, as shown in FIG. 7. Semiconductor device 100 includes an STI 72 that extends to a depth substantially equal to the thickness of silicon layer 22 and buried insulator 24 of SOI region 20. Where desired depth D (FIG. 4) is substantially equal to a thickness of silicon layer 22 and buried insulator 24 of SOI region 20, STI 72 extends to a substantially equal depth in SOI region 20 and bulk silicon region 14. The etching depth provides bulk silicon region 14 more isolation than just stopping at silicon layer 22 thickness of SOI region 20.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

The invention claimed is:

1. A method for forming a silicon trench isolation (STI) in a device including a silicon-on-insulator (SOI) region and a bulk silicon region, the method comprising:
   etching to an uppermost silicon layer using an STI mask;
   conducting a timed etch that etches to a desired depth in the bulk silicon region and stops on a buried insulator of the SOI region;
   etching through the buried insulator of the SOI region; and
   depositing an STI material to form the STI.

2. The method of claim 1, wherein the desired depth in the bulk silicon region is at least as thick as a silicon layer and the buried insulator of the SOI region.

3. The method of claim 1, further comprising the step of forming the STI mask by depositing a hardmask layer, patterning and etching to form the STI mask.

4. The method of claim 3, wherein the hardmask layer Includes tetraethyl orthosilicate (TEOS).

5. The method of claim 3, wherein the STI mask etching step includes etching through the hardmask layer and at least one of any anti-reflective coating (ARC) and a pad layer.

6. The method of claim 1, wherein the timed etching step includes using an etching recipe that is selective to the buried insulator material.

7. The method of claim 1, wherein the timed etching step removes any silicon nitride below a silicon layer of the SOI region.

8. The method of claim 1, wherein the buried insulator etching step includes removing the STI mask.

9. The method of claim 1, wherein the buried insulator etching step includes using an etching recipe incapable of etching any exposed silicon, polysilicon and silicon nitride.

10. The method of claim 1, further comprising the steps of polishing to remove the STI material above an uppermost surface, and removing a pad layer.

11. A method for etching a silicon trench isolation (STI) in a mixed silicon-on-insulator (SOI) region and a bulk silicon region device, the method comprising:
  etching to an uppermost silicon layer using an STI mask;
  conducting a timed etch that etches to a desired depth in the bulk silicon region and stops on a buried insulator of the SOI region; and
  etching Through the buried insulator of the SOI region.

12. The method of claim 11, wherein the desired depth in the bulk silicon region is at least as thick as a silicon layer and the buried insulator of the SOI region.

13. The method of claim 11, further comprising the step of forming the STI mask by depositing a hardmask layer, and patterning and etching to form the STI mask.

14. The method of claim 13, wherein the hardmask layer includes tetraethyl orthosilicate (TEOS).

15. The method of claim 13, wherein the STI mask etching step includes etching through the hardmask layer and at least one of an anti-reflective coating (ARC) and a pad layer.

16. The method of claim 11, wherein the buried insulator etching step also includes removing the STI mask.

17. The method of claim 11, wherein the timed etching step includes using an etching recipe that is selective to the buried insulator material.

18. The method of claim 11, wherein the timed etching step Includes removing any silicon nitride below a silicon layer of the SOI region.

19. The method of claim 11, wherein the buried insulator etching step also includes removing an STI mask.

20. The method of claim 11, wherein the buried insulator etching step includes using an etching recipe incapable of etching any exposed silicon, polysilicon and silicon nitride.

21. The method of claim 11, further comprising the steps of polishing to remove the STI material above an uppermost surface, and removing a pad layer.

22. A method for forming a silicon trench isolation (STI) in a device including a silicon-on-insulator (SOI) region and a bulk silicon region, the method comprising:
  providing an STI mask; and
  simultaneously forming the STI in the SOI region and the bulk silicon region,
  wherein the forming step includes:
  etching to an uppermost silicon layer using the STI mask;
  conducting a timed etch that etches to a desired depth in the bulk silicon region and stops on a buried insulator of the SOI region;
  etching through the buried insulator of the SOI region; and
  depositing an STI material to form the STI.

23. The method of claim 22, wherein the desired depth in the bulk silicon region is at least as thick as a silicon layer and the buried insulator of the SOI region.

24. The method of claim 22, wherein the timed etching step includes using an etching recipe that is selective to the buried insulator material.

25. The method of claim 22, wherein the timed etching step removes any silicon nitride below a silicon layer of the SOI region.

26. The method of claim 22, wherein the buried insulator etching step includes using an etching recipe incapable of etching any exposed silicon, polysilicon and silicon nitride.

* * * * *